(12) United States Patent
Ohsaki

(10) Patent No.: US 6,709,794 B2
(45) Date of Patent: Mar. 23, 2004

(54) EXPOSURE METHOD BASED ON MULTIPLE EXPOSURE PROCESS

(75) Inventor: Yumiko Ohsaki, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/437,399

(22) Filed: May 14, 2003

(65) Prior Publication Data

US 2003/0203318 A1 Oct. 30, 2003

Related U.S. Application Data

(62) Division of application No. 09/606,521, filed on Jun. 30, 2000, now Pat. No. 6,586,168.

(30) Foreign Application Priority Data

Jul. 1, 1999 (JP) ............................................ 11-188276

(51) Int. Cl.⁷ ................................................ G03C 5/00
(52) U.S. Cl. ............................. 430/5; 430/22; 430/394
(58) Field of Search ............................. 430/5, 22, 394

(56) References Cited

U.S. PATENT DOCUMENTS

| | | | |
|---|---|---|---|
| 4,777,641 A | 10/1988 | Inagaki et al. ................. 378/34 |
| 5,472,813 A | 12/1995 | Nakagawa et al. ............. 430/5 |
| 5,766,829 A | 6/1998 | Cathey, Jr. et al. ......... 430/394 |
| 5,902,716 A | 5/1999 | Owa et al. ................... 430/312 |
| 5,958,656 A | 9/1999 | Nakao ......................... 430/394 |
| 6,238,850 B1 | 5/2001 | Bula et al. ................... 430/394 |
| 6,351,304 B1 | 2/2002 | Kawashima et al. .......... 355/55 |
| 6,544,721 B1 * | 4/2003 | Saitoh ......................... 430/312 |
| 6,620,556 B2 * | 9/2003 | Ohsaki ........................... 430/5 |
| 2001/0036604 A1 * | 11/2001 | Kawashima .................. 430/394 |
| 2002/0012851 A1 | 1/2002 | Coronel et al. ................. 430/5 |
| 2002/0031725 A1 | 3/2002 | Sugita et al. ................. 430/311 |
| 2002/0045136 A1 | 4/2002 | Fritze et al. ................. 430/322 |
| 2002/0197543 A1 * | 12/2002 | Pierrat et al. .................. 430/5 |
| 2003/0162102 A1 * | 8/2003 | Pierrat ........................... 430/5 |

* cited by examiner

Primary Examiner—Janet Baxter
Assistant Examiner—Barbara Gilliam
(74) Attorney, Agent, or Firm—Fitzpatrick, Cella, Harper & Scinto

(57) ABSTRACT

An exposure method for printing, upon a photosensitive material, a pattern having fine lines of an odd number extending about a certain point. The method includes a multiple exposure process using a phase shift mask having an even number of boundaries defined with a phase difference of 180 degrees between adjacent regions about the point, wherein the number of the boundaries is larger than the number of fine lines.

5 Claims, 22 Drawing Sheets

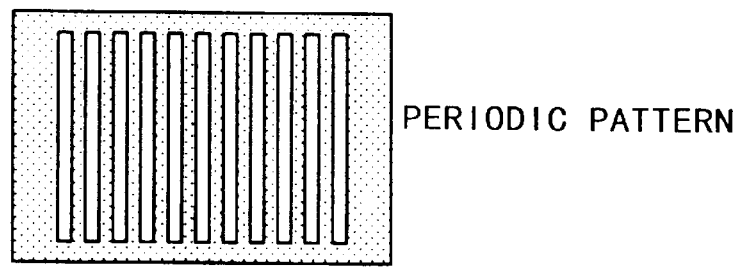
FIG. 1A — PERIODIC PATTERN
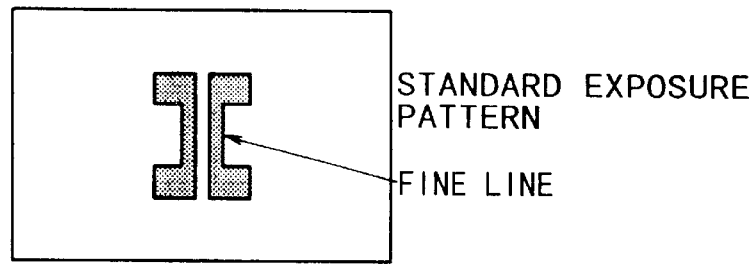
FIG. 1B — STANDARD EXPOSURE PATTERN / FINE LINE
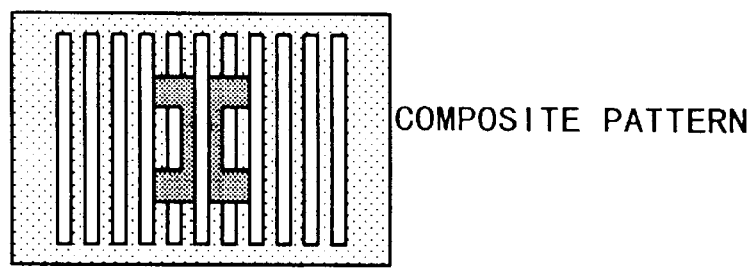
FIG. 1C — COMPOSITE PATTERN

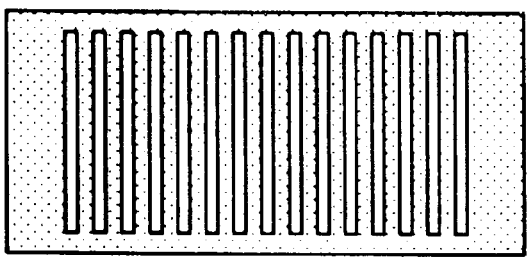
FIG. 2A  PERIODIC PATTERN
PATTERN SPACING "A"
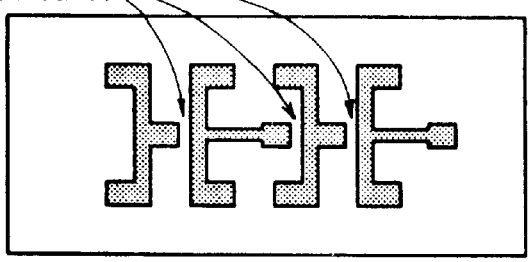
FIG. 2B  STANDARD EXPOSURE PATTERN
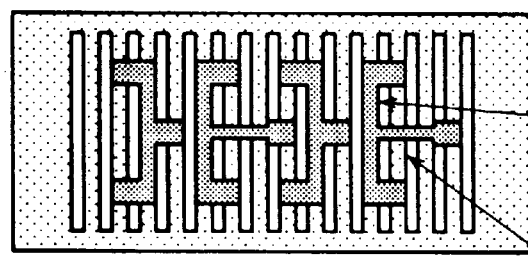
FIG. 2C  COMPOSITE PATTERN
FINE LINE ORTHOGONAL TO PERIODICITY DIRECTION
FINE LINE PARALLEL TO PERIODICITY DIRECTION

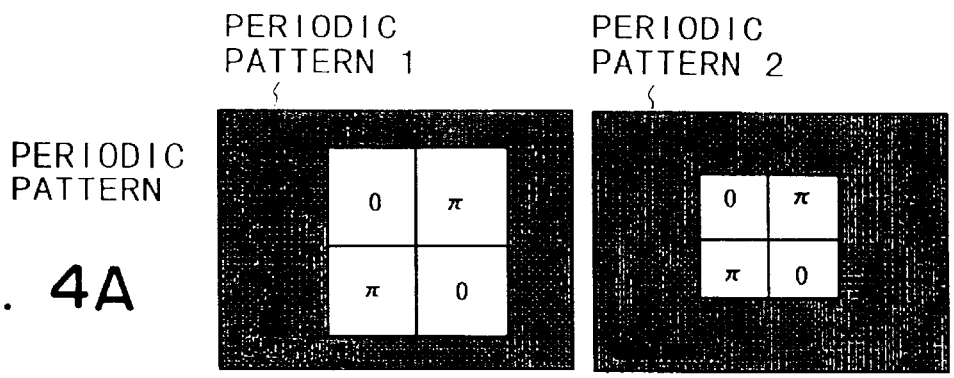
FIG. 4A PERIODIC PATTERN
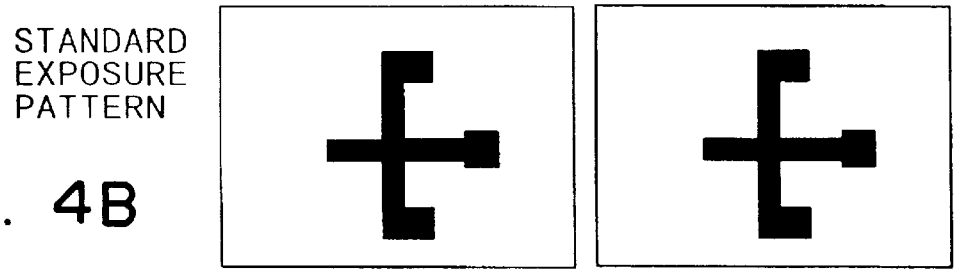
FIG. 4B STANDARD EXPOSURE PATTERN
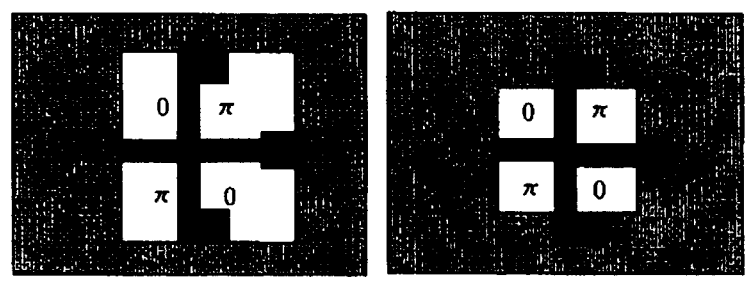
FIG. 4C COMPOSITE PATTERN

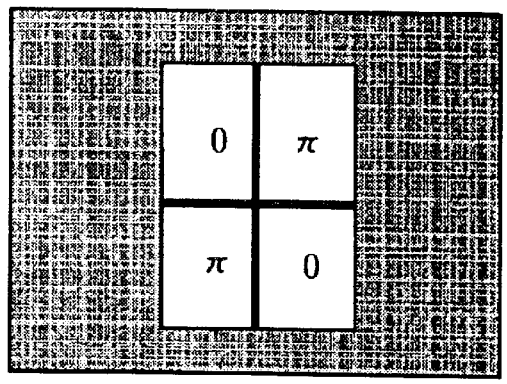
FIG. 5A  PERIODIC PATTERN
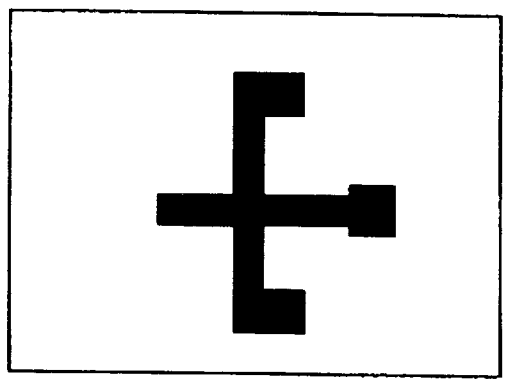
FIG. 5B  STANDARD EXPOSURE PATTERN
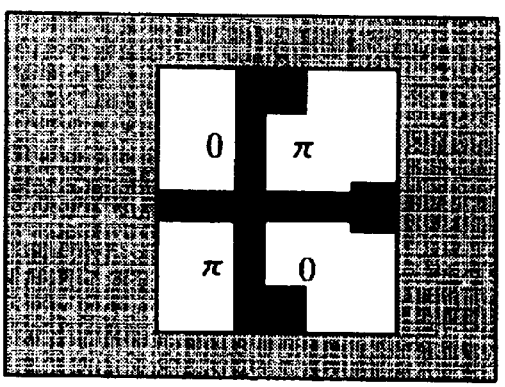
FIG. 5C  COMPOSITE PATTERN

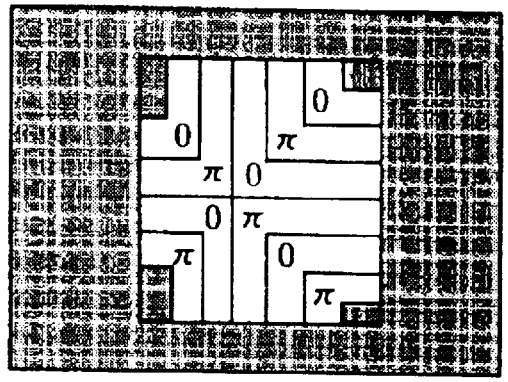
FIG. 6A  PERIODIC PATTERN
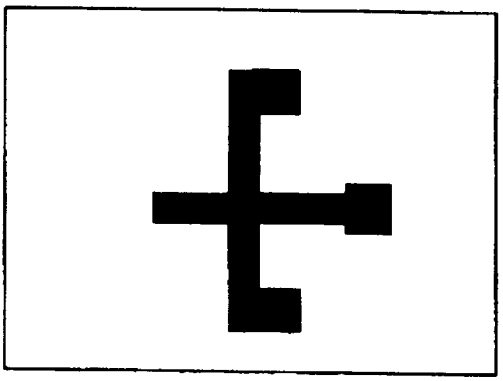
FIG. 6B  STANDARD EXPOSURE PATTERN
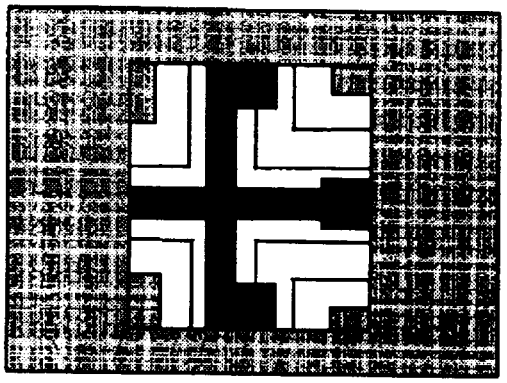
FIG. 6C  COMPOSITE PATTERN

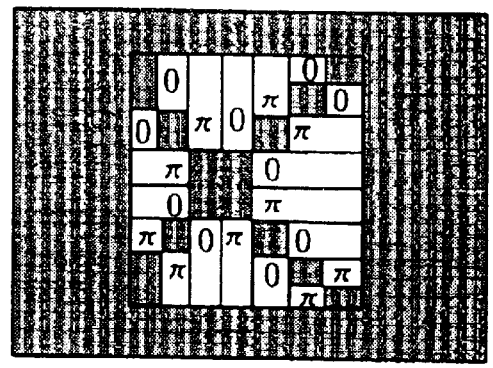
FIG. 7A  PERIODIC PATTERN
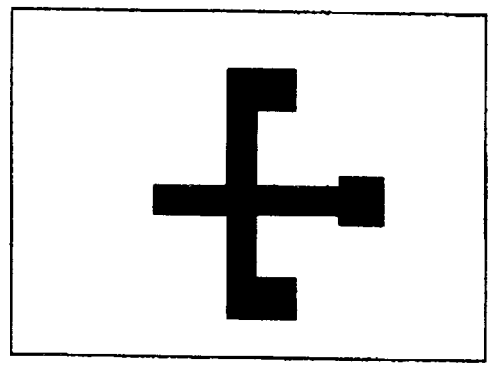
FIG. 7B  STANDARD EXPOSURE PATTERN
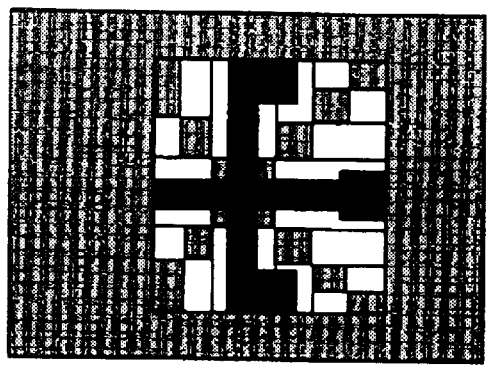
FIG. 7C  COMPOSITE PATTERN FIG. 8A  PERIODIC PATTERN
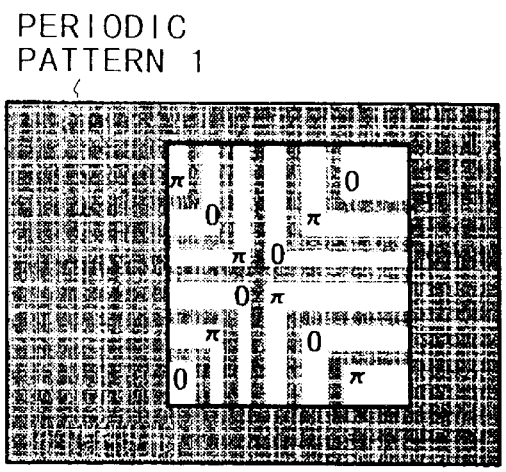
FIG. 8B  STANDARD EXPOSURE PATTERN
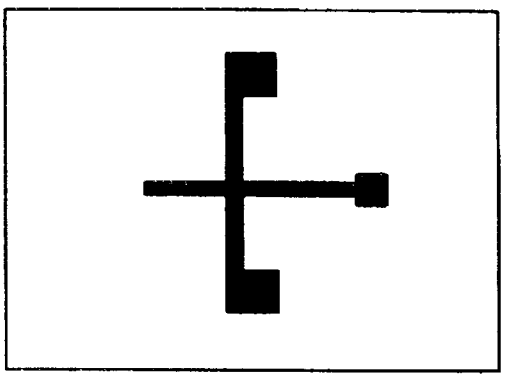
FIG. 8C  COMPOSITE PATTERN
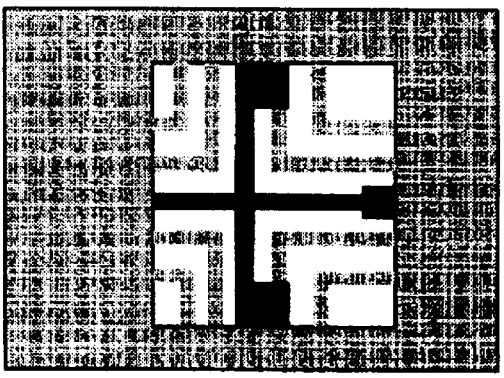

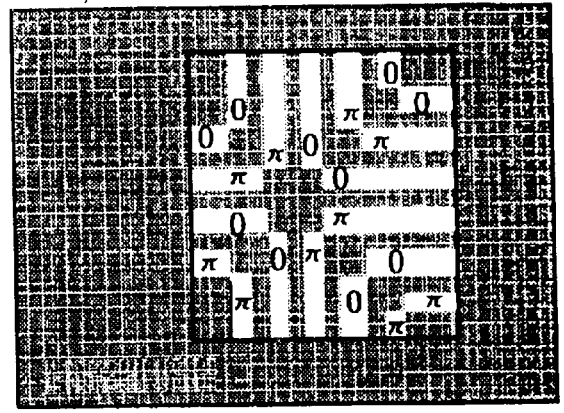
FIG. 9A  PERIODIC PATTERN
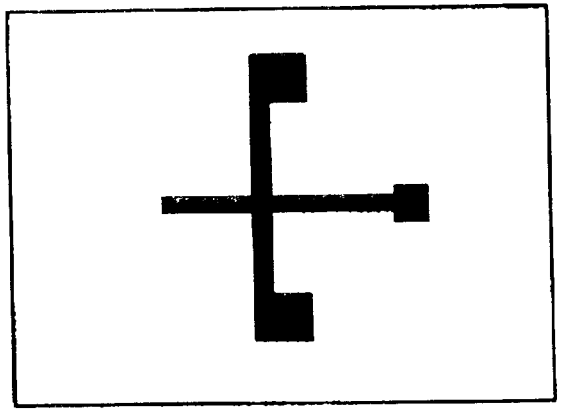
FIG. 9B  STANDARD EXPOSURE PATTERN
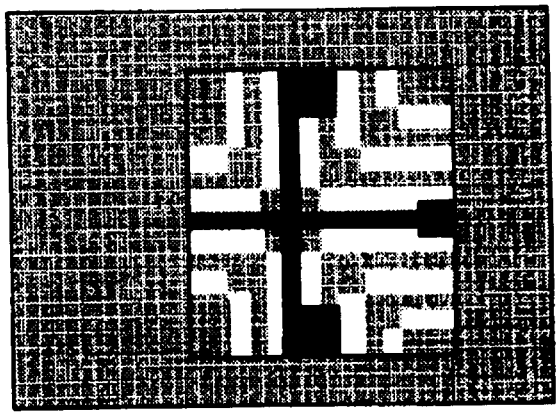
FIG. 9C  COMPOSITE PATTERN

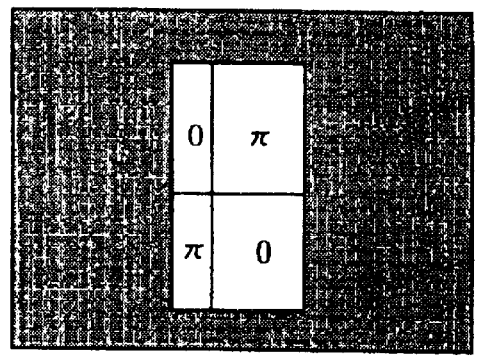
FIG. 10A  PERIODIC PATTERN
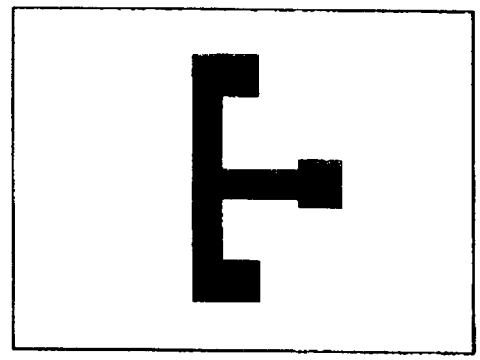
FIG. 10B  STANDARD EXPOSURE PATTERN
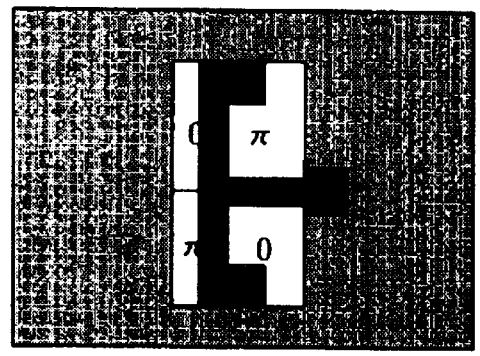
FIG. 10C  COMPOSITE PATTERN def: 0.0000    def: 0.0002    def: 0.0004
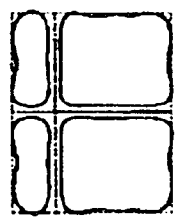 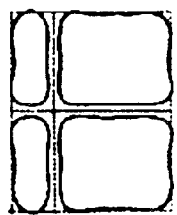 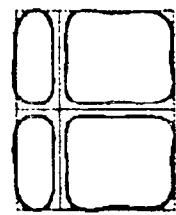
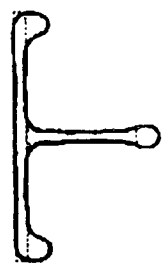 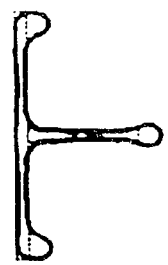 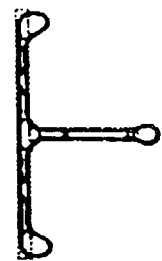
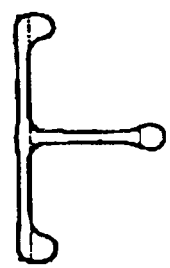 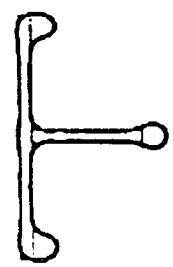 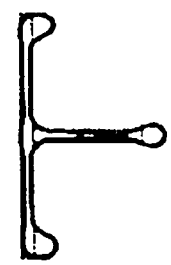
FIG. 11

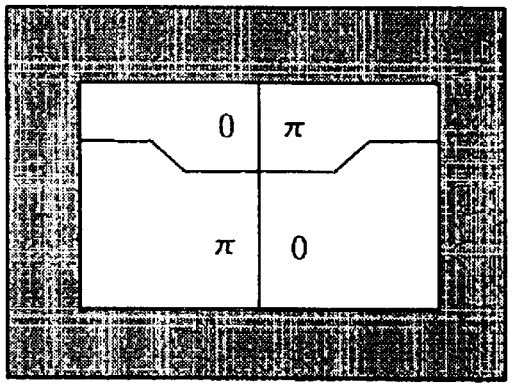
FIG. 12A  PERIODIC PATTERN
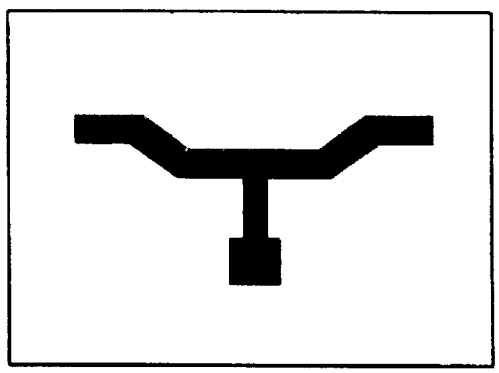
FIG. 12B  STANDARD EXPOSURE PATTERN
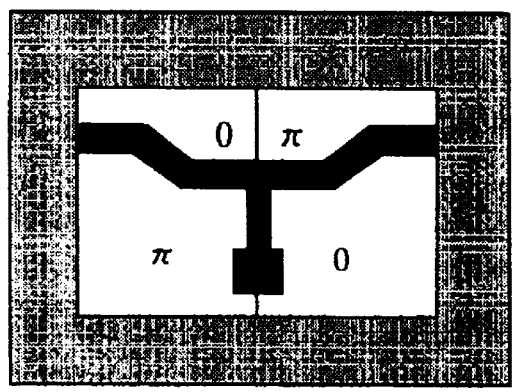
FIG. 12C  COMPOSITE PATTERN

PERIODIC
PATTERN

STANDARD
EXPOSURE
PATTERN

COMPOSITE
PATTERN

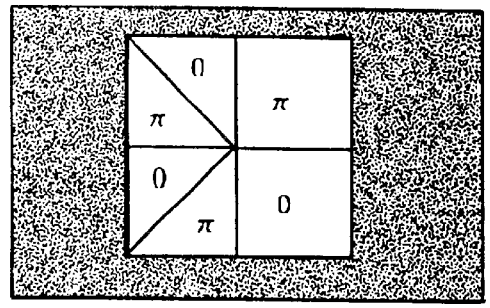
FIG. 15A  PERIODIC PATTERN
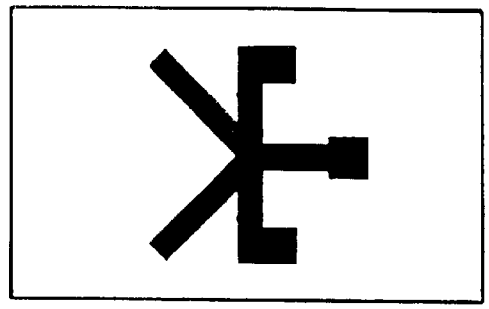
FIG. 15B  STANDARD EXPOSURE PATTERN
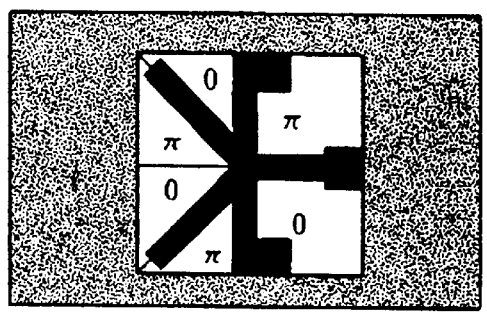
FIG. 15C  COMPOSITE PATTERN

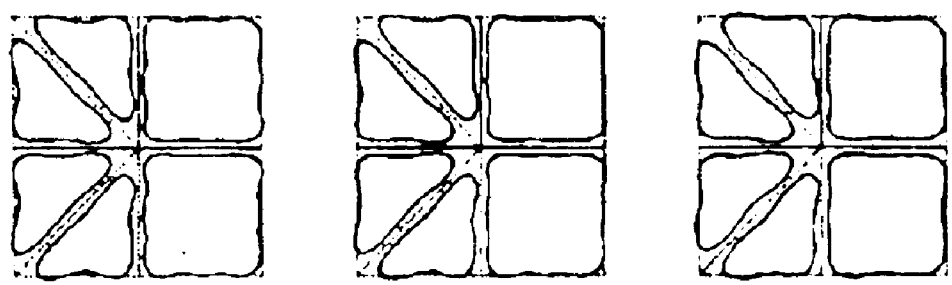
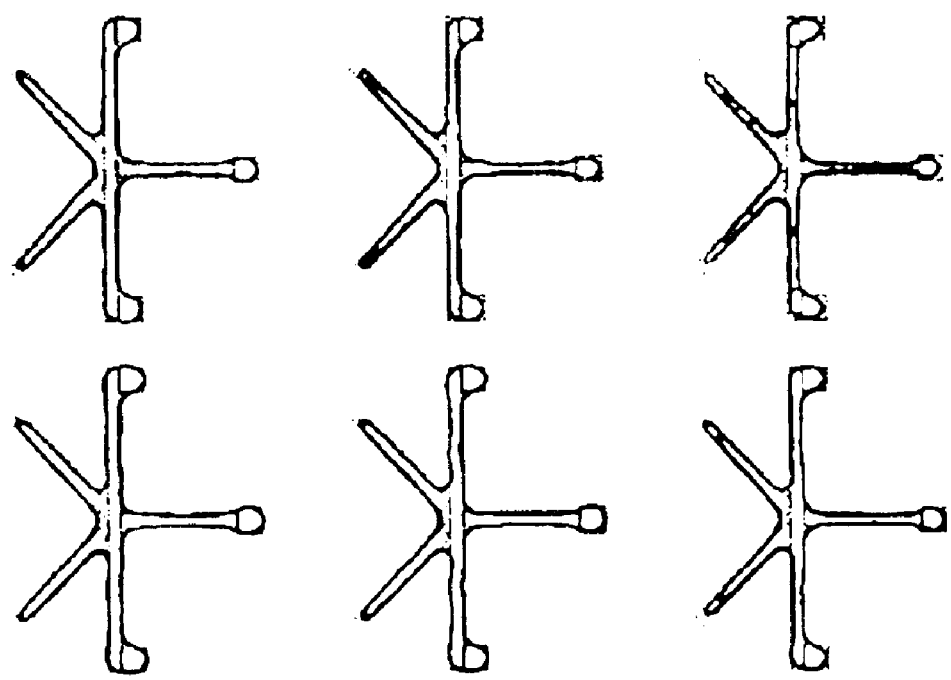
FIG. 16

FIG. 17A  PERIODIC PATTERN  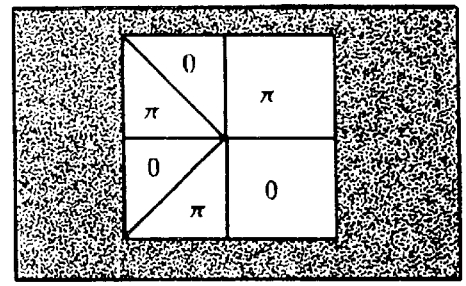
FIG. 17B  STANDARD EXPOSURE PATTERN  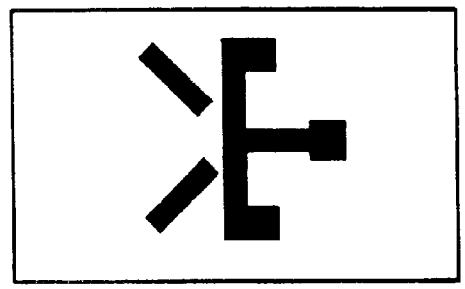
FIG. 17C  COMPOSITE PATTERN  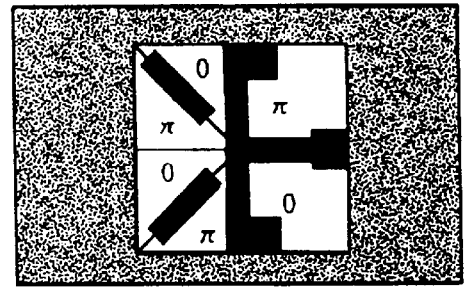

SINGLE-EXPOSURE
PERIODIC PATTERN
DOUBLE-EXPOSURE
(MULTIPLE-VALUE)
STANDARD PATTERN
DUAL EXPOSURE
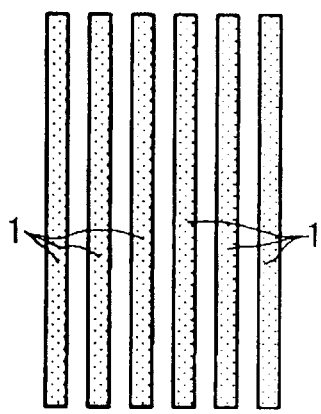
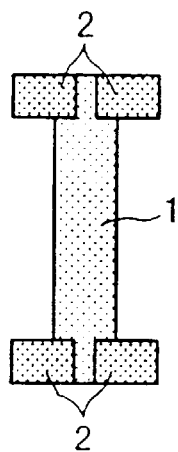
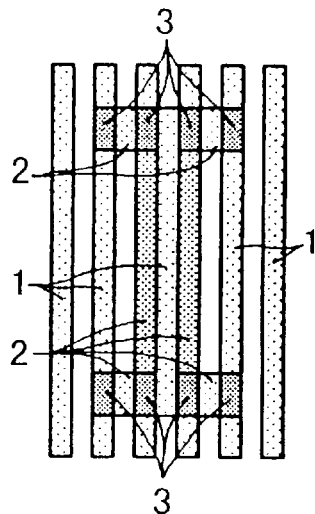
FIG. 20A  FIG. 20B  FIG. 20C
PERIODIC PATTERN
(PHASE SHIFT MASK)
STANDARD PATTERN
(LIGHT-TRANSMISSIVE
PATTERN MASK)
STANDARD PATTERN
(LIGHT-BLOCKING
PATTERN MASK)
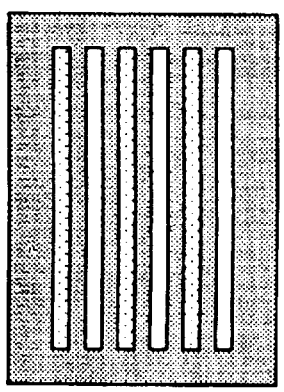
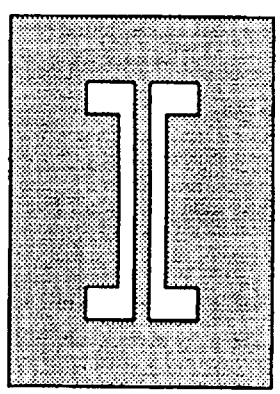
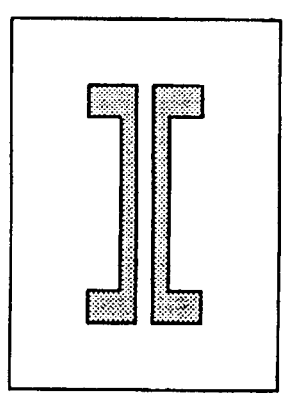
FIG. 21A  FIG. 21B  FIG. 21C

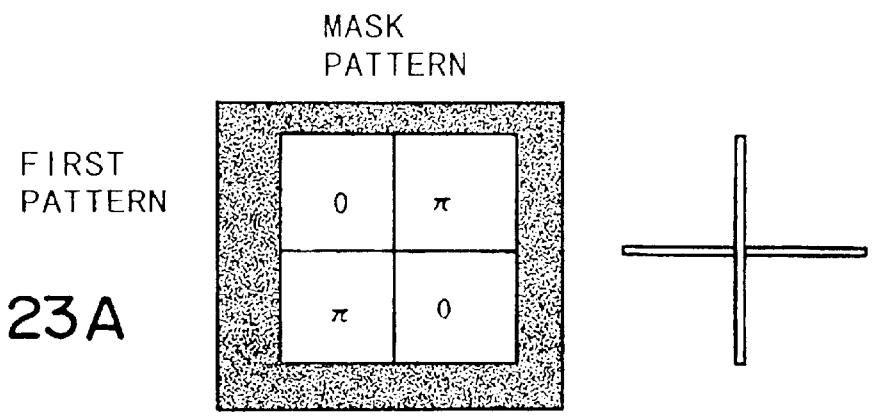
FIG. 23A  FIRST PATTERN / MASK PATTERN
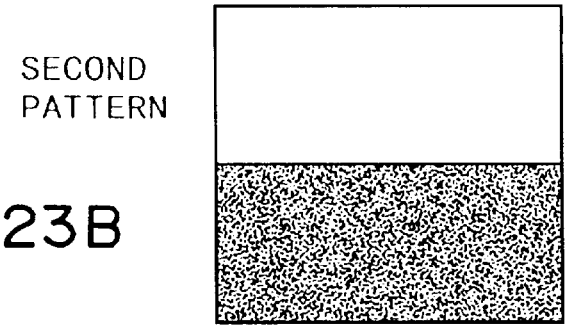
FIG. 23B  SECOND PATTERN
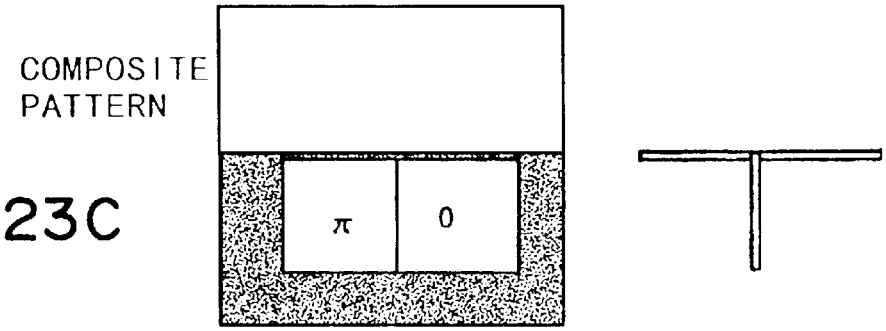
FIG. 23C  COMPOSITE PATTERN

EXPOSURE METHOD BASED ON MULTIPLE EXPOSURE PROCESS

This application is a divisional application of copending U.S. patent application Ser. No. 09/606,521, filed Jun. 30, 2000 now U.S. Pat. No. 6,586,168.

FIELD OF THE INVENTION AND RELATED ART

This invention relates to an exposure method, an exposure apparatus and a device manufacturing method. More particularly, the invention concerns an exposure method and apparatus for transferring a very fine circuit pattern onto a photosensitive substrate through multiple exposures. The exposure method and apparatus of the present invention are suitably usable for the manufacture of various devices such as semiconductor chips (e.g., ICs or LSIs), display devices (e.g., liquid crystal panels), detecting devices (e.g., magnetic heads), or image pickup devices (e.g., CCDs), or for the production of patterns to be used in micro-mechanics.

The manufacture of microdevices such as ICs, LSIs or liquid crystal panels, for example, use a projection exposure method and a projection exposure apparatus wherein a circuit pattern formed on a photomask or reticle (hereinafter, "mask") is projected through a projection optical system onto a photosensitive substrate such as a silicon wafer or a glass plate (hereinafter, "wafer") which is coated with a photoresist, for example, by which the circuit pattern is transferred (photoprinted) to the wafer.

In order to meet enlargement of integration of a device (chip), miniaturization of a pattern to be transferred to a wafer, that is, improvements in resolution, as well as enlargement in area of each chip have been desired. Thus, in a projection exposure method and projection exposure apparatus which play a main role in the wafer microprocessing procedure, many attempts have been made to improve the resolution and to enlarge the exposure area in order that an image of a size (linewidth) of 0.5 micron or less can be formed in a wider range.

FIG. 22 is a schematic view of a conventional projection exposure apparatus, wherein denoted at 191 is an excimer laser which is a deep ultraviolet light exposure light source. Denoted at 192 is an illumination optical system, and denoted at 193 is illumination light. Denoted at 194 is a mask, and denoted at 195 is object side exposure light emitted from the mask 194 and entering an optical system 196 which is a reduction projection optical system. Denoted at 197 is image side exposure light emitted from the optical system 196 and impinging on a substrate 198 which is a photosensitive substrate (wafer). Denoted at 199 is a substrate stage for holding the photosensitive substrate.

Laser light emitted from the excimer laser 191 is directed by a guiding optical system to the illumination optical system 192, by which the laser light is adjusted to provide the illumination light 193 having a predetermined light intensity distribution, a predetermined orientation distribution, and a predetermined opening angle (numerical aperture NA), for example. The illumination light 193 then illuminates the mask 194.

The mask 194 has formed thereon a pattern of a size corresponding to the size of a fine pattern to be formed on the wafer 198 but as being multiplied by an inverse of the projection magnification of the projection optical system 196 (namely, 2×, 4× or 5×, for example). The pattern is made of chromium, for example, and it is formed on a quartz substrate. The illumination light 193 is transmissively diffracted by the fine pattern of the mask 194, whereby the object side exposure light 195 is provided. The projection optical system 196 serves to convert the object side exposure light 195 to the image side exposure light 197 with which the fine pattern of the mask 194 can be imaged upon the wafer 198 at the projection magnification and with a sufficiently small aberration. As shown in a bottom enlarged view portion of FIG. 22, the image side exposure light 197 is converged on the wafer 198 with a predetermined numerical aperture NA (=sin θ), whereby an image of the fine pattern is formed on the wafer 198. The substrate stage 199 is movable stepwise along the image plane of the projection optical system to change the wafer 198 position relative to the projection optical system 196, such that fine patterns are formed sequentially on different regions on the wafer 198 (e.g., shot regions each covering one or more chips).

However, with projection exposure apparatuses currently used prevalently and having an excimer laser as a light source, it is still difficult to produce a pattern image of 0.15 micron or less.

As regards the resolution of the projection optical system 196, there is a limitation due to a "trade off" between the depth of focus and the optical resolution attributable to the exposure wavelength (used for the exposure process). The resolution R of a pattern to be resolved and the depth of focus DOF of a projection exposure apparatus can be expressed by Rayleigh's equation, such as equations (1) and (2) below.

$$R=k_1(\lambda/NA) \quad (1)$$

$$DOF=k_2(\lambda/NA^2) \quad (2)$$

where λ is the exposure wavelength, NA is the image side numerical aperture which represents the brightness of the projection optical system 196, and $k_1$ and $k_2$ are constants which are determined by the development process characteristics, for example, and which are normally about 5–0.7. From equations (1) and (2), it is seen that, while enhancement of resolution, that is, making the resolution R smaller, may be accomplished by enlarging the numerical aperture NA (NA enlarging), since in a practical exposure process the depth of focus DOF of the projection optical system 196 cannot be shortened beyond a certain value, increasing the numerical aperture NA over a large extent is not attainable, and also that, for enhancement of resolution, narrowing the exposure wavelength λ (band-narrowing) is anyway necessary.

However, such band-narrowing encounters a critical problem. That is, there will be no glass material available for lenses of the projection optical system 196. In most glass materials, the transmission factor is close to zero, with respect to the deep ultraviolet region. Although there is fused silica, which is a glass material produced for use in an exposure apparatus (exposure wavelength of about 248 nm) in accordance with a special method, even the transmission factor of fused silica largely decreases with respect to the exposure wavelength not longer than 193 nm. It is very difficult to develop a practical glass material for a region of an exposure wavelength of 150 nm or shorter, corresponding to a very fine pattern of 0.15 micron or less. Further, glass materials to be used in the deep ultraviolet region should satisfy various conditions, other than the transmission factor, such as durability, uniformness of refractive index, optical distortion, easiness in processing, etc. In these situations, the availability of practical glass materials is not large.

As described, in conventional projection exposure methods and projection exposure apparatuses, the band-narrowing of the exposure wavelength to about 150 nm or shorter is required for formation of a pattern of 0.15 micron or less upon a wafer 198 whereas there is no practical glass material for such a wavelength region. It is, therefore, very difficult to produce a pattern of 0.15 micron or less on a wafer.

Recently, an exposure method and apparatus for performing a dual exposure process, comprising a periodic pattern exposure and a standard (ordinary) exposure, to a substrate (photosensitive substrate) to be exposed, has been proposed in an attempt to produce a circuit pattern including a portion of 0.15 micron or less.

Here, the term "standard exposure" or "ordinary exposure" refers to an exposure process by which an arbitrary pattern can be photoprinted although the resolution is lower than that of the periodic pattern exposure. A representative example of it is the exposure process to be performed by projection of a mask pattern with a projection optical system.

A pattern to be printed by the standard exposure (hereinafter, "standard exposure pattern") may include a very fine pattern less than the resolution. The periodic pattern exposure is a process for forming a periodic pattern of a similar linewidth as that of the very fine pattern.

Such periodic pattern exposure may use a Levenson type phase shift mask, for example. An example of a dual exposure process is shown in FIGS. 1A–1C. A periodic pattern (FIG. 1A) and a standard exposure pattern (FIG. 1B) are printed on the same position, by which a very fine pattern (FIG. 1C) corresponding to a composite image of them is produced.

In this manner, a pattern to be produced finally is photoprinted as a standard exposure pattern, but, since the standard exposure pattern contains a pattern portion lower than the resolution, a predetermined portion of a periodic pattern having high resolution is printed at the same position as the pattern lower than the resolution. As a result of it, the resolution of the standard exposure pattern can be improved and, finally, a desired pattern including a very fine line smaller than the resolution can be produced.

More specifically, in order to improve the resolution of a standard exposure pattern (FIG. 1B), a high resolution periodic pattern (FIG. 1A) is printed on the same position. In such a dual exposure process, if the elongation direction of the fine-line portion of the pattern of FIG. 1B is registered with the periodicity direction in FIG. 1A, no particular problem arises.

If, however, a standard exposure pattern includes fine lines of different directions, such as shown in FIG. 2B wherein there are fine lines extending in the same direction as the periodicity and fine lines extending in a direction perpendicular thereto, while the fine lines in the same direction as the periodicity may be resolved, the fine lines extending perpendicularly to the periodicity may not be resolved.

Details will be described with reference to a pattern called a gate pattern or a T gate pattern, used with a positive type resist material, in conjunction with FIGS. 1A–1C and 2A–2C. It is assumed now that in these drawings the periodic pattern comprises such a pattern that light passes therethrough by which its phase is inverted. This periodic pattern has a periodicity not less than 2. The standard exposure pattern comprises such a pattern that light passes through the peripheral portion around the pattern which blocks light, and it has a binary amplitude with a constant phase.

For example, in FIGS. 1A–1C, each fine line of the gate pattern of FIG. 1B (standard exposure pattern) is oriented in the same direction as the periodic pattern of FIG. 1A. Thus, the resolution of the fine line of the gate pattern of FIG. 1A (standard exposure pattern) can be increased.

In the example of a T gate pattern shown in FIG. 2B, there are additional fine lines extending like a T-shape, orthogonally to fine lines of a gate pattern. Thus, there are fine lines extending in different directions.

If there are fine lines extending longitudinally and laterally, resolution is particularly difficult to achieve in such a zone (hard-resolution zone), i.e., pattern spacings "A", where a fine line and a pattern are juxtaposed with each other with a spacing not larger than the resolution. In order to attain improved resolution for such a zone, use of a periodic pattern such as shown in FIG. 2A is necessary. However, the mere use of such a periodic pattern would result in disconnection of each fine line extending in a direction perpendicular to the periodicity, although resolution may be accomplished for the hard-resolution zone.

Therefore, when a dual exposure process using a periodic pattern and a standard exposure pattern is to be performed, a pattern to be produced finally is limited in some cases, depending on the orientation of the periodic pattern used. Particularly, as regards a pattern having fine lines extending in a direction different from the periodicity direction of the periodic pattern, it is difficult to well meet the same, with the dual exposure process used conventionally.

SUMMARY OF THE INVENTION

It is accordingly an object of the present invention to provide an exposure method, an exposure apparatus and/or a device manufacturing method, by which, when a multiple exposure process is to be performed by using plural mask patterns being different in image contrast, every fine line (including a case of a complicated pattern having fine lines extending in different directions) can be reproduced successfully.

In accordance with an aspect of the present invention, there is provided an exposure method for printing, upon a photosensitive material, a pattern having fine lines of an odd number extending about a certain point, through a multiple exposure process, characterized in that a phase shift mask having an even number of boundaries defined with a phase difference of 180 deg. between adjacent regions about the point, is used, wherein the number of the boundaries is larger than the number of fine lines.

In accordance with another aspect of the present invention, there is provided a multiple exposure method using plural masks, characterized in that a position where an image of a low-contrast pattern is to be formed on the basis of a mask, of the masks, having fine lines extending in different directions, is exposed with an image of a pattern of a mask having a phase difference of 180 deg. between adjacent patterns, whereby a contrast of an exposure amount distribution related to the pattern of the low contrast is increased.

In accordance with a further aspect of the present invention, there is provided an exposure apparatus having an exposure mode for performing an exposure method as recited above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A–1C are schematic views for explaining an example of a pattern layout for a dual exposure process, where no inconvenience is caused.

FIGS. 2A–2C are schematic views for explaining another example of a pattern layout for a dual exposure process, where, due to presence of fine line elements in different directions, inconveniences are caused.

FIGS. 4A–4C are schematic views, respectively, for explaining a procedure for making a composite pattern in a first embodiment of the present invention.

FIGS. 5A–5C are schematic views, respectively, for explaining a procedure for making a composite pattern in a second embodiment of the present invention.

FIGS. 6A–6C are schematic views, respectively, for explaining a procedure for making a composite pattern in a third embodiment of the present invention.

FIGS. 7A–7C are schematic views, respectively, for explaining a procedure for making a composite pattern in another example of the third embodiment of the present invention.

FIGS. 8A–8C are schematic views, respectively, for explaining a procedure for making a composite pattern in a fourth embodiment of the present invention.

FIGS. 9A–9C are schematic views, respectively, for explaining a procedure for making a composite pattern in another example of the fourth embodiment of the present invention.

FIGS. 10A–10C are schematic views, respectively, for explaining a procedure for making a composite pattern in a fifth embodiment of the present invention.

FIG. 11 shows the results of simulations in the fifth embodiment.

FIGS. 12A–12C are schematic views, respectively, for explaining a procedure for making a composite pattern in a sixth embodiment of the present invention.

FIGS. 15A–15C are schematic views, respectively, for explaining a procedure for making a composite pattern in a ninth embodiment of the present invention.

FIG. 16 shows the results of simulations in the ninth embodiment.

FIGS. 17A–17C are schematic views, respectively, for explaining a procedure for making a composite pattern in another example of the ninth embodiment of the present invention.

FIGS. 20A–20C are schematic views, respectively, for explaining the principles of a dual exposure process.

FIGS. 21A–21C are schematic views similar to FIGS. 20A–20C, respectively, and for explaining the principles of a dual exposure process.

FIGS. 23A–23C are schematic views, respectively, for explaining a procedure for making a composite pattern in a tenth embodiment of the present invention.

DESCRIPTION OF THE PREFERRED EMBODIMENTS

Figure 3:
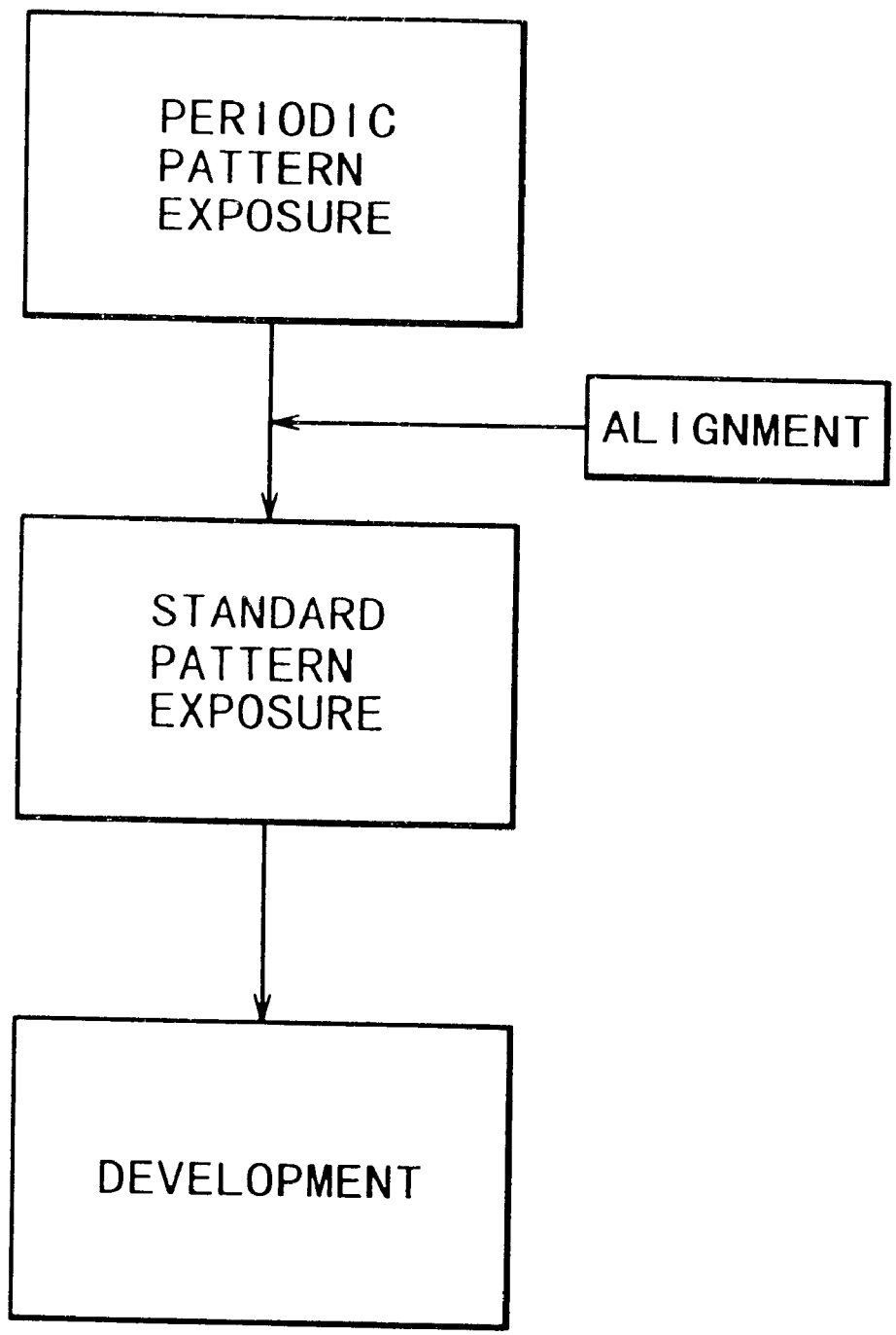
FIG. 3 is a flow chart for a dual exposure process.

Briefly, in the present invention, for a dual exposure process using a periodic pattern and a standard exposure pattern, for example, if fine lines or extensions of them intersect with each other at a single point, an edge of zero intensity produced at a boundary of patterns, having a phase difference of 180 deg., is used. By this, all fine lines can be reproduced successfully.

When a periodic pattern comprises edges of zero intensity defined at boundaries of patterns, having a phase difference of 180 deg., these boundaries are placed to be superposed with all the fine lines of a standard exposure pattern.

Here, in the periodic pattern, if the regions of phases 0 and π are alternately placed so that a phase difference of 180 deg. is produced between juxtaposed regions, the result is that there are patterns and boundaries between them. Namely, regardless of the number of fine lines of the standard exposure pattern, a periodic pattern divided into regions of an even number to provide a phase difference of 180 deg. is used.

When a periodic pattern has a phase difference of 180 deg. between juxtaposed regions and the boundaries are placed so that edges at the boundaries are superposed with all the fine lines of the standard exposure pattern, if the number of the fine lines of the standard exposure pattern is even, the periodic pattern may have edges of an even number so that they are superposed with the fine lines.

If the number of the fine lines of the standard exposure pattern is odd, a periodic pattern may have an odd number of edges. However, with this structure, all the patterns do not have alternate phases. In consideration of this, even if the standard exposure pattern has an odd number of fine lines, the periodic pattern is formed with edges of an even number larger than the number of the fine lines by one. By superposing these edges with the fine lines of the standard exposure pattern, all the fine lines can be resolved successfully.

It is seen from the above that, regardless of whether the number of fine lines of the standard exposure pattern is even or odd, a periodic pattern is formed with an even number of edges of a phase difference of 180 deg., by which all the fine lines can be reproduced successfully.

The dual exposure process assures improvement of resolution, by printing two patterns at the same position. Thus, a periodic pattern to be used is designed in accordance with a standard exposure pattern.

As described above, in an exposure method wherein dual exposure of a standard exposure and a periodic pattern exposure is performed, where fine lines or extensions of them intersect with each other at a single point, edges of zero intensity defined at boundaries of a phase difference of 180 deg., about the intersection point, are used, by which all the fine lines can be resolved successfully.

By using a periodic pattern such as described above, all the fine lines can be reproduced successfully even if the fine lines extend in different directions.

Preferred embodiments of the present invention will be described below. FIG. 3 is a flow chart of a dual exposure process. The blocks in FIG. 3 illustrate the flow of procedures, that is, periodic pattern exposure, standard exposure and development. The order of the periodic pattern exposure and the standard exposure may be the one shown in the drawing, but it may be reversed. If one or both of the periodic exposure and the standard exposure comprise plural exposure steps, they may be made alternately.

Between the periodic pattern exposure and the standard exposure, a process for precise alignment between a mask and a wafer may be performed. A description of details of such an alignment operation will be omitted here.

These embodiments relate to a specific arrangement of a periodic pattern, for use in a dual exposure process (periodic pattern exposure and standard pattern exposure) to be performed through a stepper having a KrF excimer laser having a wavelength of 248 nm, for example.

Now, the principle of pattern formation based on a dual exposure process in the present invention will be explained.

The dual exposure process is a method in which a standard exposure step and a periodic pattern exposure step are carried out without intervention of a development process. More specifically, a periodic pattern is printed at a level not greater than an exposure threshold of a resist and, thereafter, a standard exposure is executed with an exposure amount having a multiple-level distribution. As regards the exposure amount of the standard exposure, different exposure amounts are applied to small zones of an exposure pattern region (exposure region). The exposure amount in each small zone may be either larger or smaller than the exposure threshold level. Here, the exposure amount referred to in the specification relates to an exposure amount with respect to a resist.

Referring now to FIGS. 21A–21C, an example of a gate pattern having a shape such as shown in these drawings will be described, in relation to production of a circuit pattern (lithography pattern) obtainable photolithographically.

The gate pattern has a smallest linewidth of 0.1 micron in the lateral direction (which is greater than the resolution of the standard exposure in the exposure apparatus), whereas it has a smallest linewidth in the longitudinal direction of 0.2 micron or more which is within the range of resolution of the standard exposure. In accordance with the dual exposure method, for such a two-dimensional pattern having a smallest linewidth pattern in which high resolution is required only in a one-dimensional direction, that is, lateral direction, a periodic pattern exposure with dual beam interference exposure, for example, may be performed only in relation to the one-dimensional direction in which high resolution is required.

FIGS. 20A–20C show exposure amount distributions at corresponding exposure stages. Numerical values given in these drawings represent exposure amounts at the resist.

FIG. 20A shows an exposure amount distribution of a periodic exposure pattern having repetitions only in a one-dimensional direction. The exposure amount at a portion other than the pattern (exposed with light) is zero, and that at the pattern portion is 1.

FIG. 20B shows a multiple-level exposure amount distribution produced by a standard exposure. The exposure amount at a portion other than the pattern is zero, and that at the pattern portion is 1 or 2. Thus, two-level distribution of 1 and 2 is produced here.

When a dual exposure process including these exposure steps is carried out without intervention of a development process, an accumulated distribution of exposure amounts is produced on the resist, and thus an exposure amount distribution such as shown in FIG. 20C is obtainable. Here, if the resist sensitivity threshold level is between 1 and 2, the zones exposed with a level more than 1 (i.e., level 2 or 3 in the drawing) are "printed", such that a pattern as depicted by a thick dark line in FIG. 20C can be produced, after a development process.

On the other hand, an exposure pattern corresponding to the periodic pattern which is outside the zones depicted by the thick dark line, has been exposed with a level lower than the resist exposure threshold, such that it will disappear after the development process.

As regards those zones exposed by the standard exposure with an exposure amount distribution less than the resist exposure threshold level, such a zone where the sum (accumulation) of the exposure amount distribution provided by the standard exposure and the exposure amount distribution provided by the periodic pattern exposure becomes not lower than the resist exposure threshold level, can be developed by the development process as a "print". As a result, an exposure pattern having the same resolution as that of the exposure pattern by the periodic pattern exposure can be produced, at the superposed portions of the exposure patterns provided by the standard exposure and the periodic pattern exposure.

As regards the zones of the exposure pattern exposed by the standard exposure with an exposure amount distribution not less than the resist exposure threshold level, an exposure pattern having the same resolution as that of an exposure pattern by the standard exposure is produced as the superposition of exposure patterns of the standard exposure and the periodic pattern exposure.

FIGS. 21A–21C illustrate a pattern and a mask for producing exposure amount distributions shown in FIGS. 20A–20C. FIG. 21A shows a pattern and a mask adapted to produce a repetition pattern, being repeated only in a one-dimensional direction in which a high resolution is required. This mask may be provided by a Levenson type phase shift mask, for example. When such a Levenson type phase shift mask is used, phases are mutually inverted between white (blank) areas and gray (dark) areas in the drawing. With the phase inversion effect, a high-contrast periodic exposure pattern can be produced in accordance with the dual beam interference exposure process. The mask is not limited to a Levenson type phase shift mask, but any one can be used if it produces such an exposure amount distribution.

Here, the exposure pattern has a periodicity of 0.2 micron, and it comprises a line-and-space pattern with lines and spaces each having a linewidth of 0.1 micron. It serves to produce the exposure amount distribution shown in FIG. 20A. As regards a mask for producing such a multiple-level pattern, a mask having formed thereon a pattern analogous to a circuit pattern to be produced finally, may be used. In this example, a mask having been transformed with a gate pattern such as shown in FIG. 21B is used.

As described hereinbefore, a portion of a gate pattern formed by fine lines (longitudinal line elements in this example) consist of patterns narrower than the resolution of standard exposure. Therefore, these two linear patterns comprising very fine lines are not resolved on a resist, and a distribution with low and even intensity is produced. As compared therewith, patterns at the opposite ends of the fine line elements have a linewidth in a range of the resolution of standard exposure of the exposure apparatus, and they can be resolved as a high intensity pattern.

Therefore, as the pattern and mask of FIG. 21B is photoprinted, a multiple-level exposure amount distribution such as shown in FIG. 20B is produced.

In this example, a light transmission type pattern is used to provide an exposure amount distribution corresponding to a pattern to be produced. However, a light blocking type pattern may be used if a mask such as shown in FIG. 21C is prepared. A light blocking type pattern is usable with a mask arranged so that light passes through a region other than the pattern, while the pattern functions to block light. In such a light blocking type pattern, a pattern larger than the resolution functions to completely block light, such that it provides an exposure amount distribution of zero. On the other hand, a fine pattern narrower than the resolution does not completely block light, so that an exposure amount about a half of the exposure amount distribution in the region around the pattern is distributed. As a result of it, a multiple-level exposure amount distribution is produced.

The principle of a dual exposure process described above, is summarized as follows.

(1) An exposure pattern in a zone not exposed by a standard exposure, as produced by a periodic pattern exposure and having a largest exposure amount not greater than the resist exposure threshold level, will disappear as a result of a development process.

(2) As regards an exposure pattern region (exposure region) provided by a standard exposure, in which an exposure amount not greater than the resist exposure threshold has been supplied to the resist, an exposure pattern having the same resolution as that of an exposure pattern by the periodic pattern exposure and being determined by the combination of exposure patterns to be produced by the standard exposure and the periodic pattern exposure, is produced.

(3) As regards an exposure pattern region (exposure region) provided by a standard exposure, in which an exposure amount not lower than the resist exposure threshold level has been supplied to the resist, an exposure pattern having the same resolution as that of an exposure pattern by the standard exposure is produced.

An advantage of the dual exposure method is that, when a periodic pattern exposure to which a highest resolution is required is performed in accordance with a dual-beam interference exposure method using a phase shift mask, for example, a depth of focus quite larger than that as attainable with the imaging of a periodic pattern by ordinary projection exposure is attainable.

As regards the order of the periodic pattern exposure and the standard exposure, while in the foregoing description the periodic pattern exposure is made first, these exposures may be made in a reverse order or they may be made at the same time.

Now, some preferred embodiments will be described below in conjunction with examples of periodic patterns specifically arranged for use with a stepper having a KrF excimer laser having a wavelength of 248 nm, and with a dual exposure process including a periodic pattern exposure and a standard exposure for a wafer. With a periodic pattern exposure, an image of high contrast is obtainable. With a standard exposure pattern, an image of low contrast is obtainable.

Embodiment 1

The first embodiment relates to a periodic pattern for forming an exposure pattern for lithography having four fine intersecting lines. The first embodiment will be described with reference to FIGS. 4A–4C.

FIG. 4A shows periodic patterns, and FIG. 4B shows standard exposure patterns, to be used practically. FIG. 4C shows composite patterns and illustrates the positional relationship of the periodic pattern and the standard exposure pattern, for a dual exposure process. By combining a periodic pattern and a standard exposure pattern, a composite pattern of the same shape as that of the standard pattern (FIG. 4B) is produced. In each standard exposure pattern shown in FIG. 4B, there are four intersecting lines, and free ends are connected to contact holes. As regards the light intensity distribution of the standard exposure pattern, upon a wafer, since it contains a fine line not greater than the resolution, multiple levels are produced at the fine line portion and the contact hole portion. In this embodiment, for both the periodic pattern and the standard exposure pattern, the resist threshold is not reached by a single exposure. It is reached by double exposures. This applies to all of the first to ninth embodiments described below.

For reproduction of four fine lines, a periodic pattern (1 or 2) such as shown in FIG. 4A is used. Each fine line is produced by using an edge portion of zero intensity defined by a phase difference between a zone of phase zero and a zone of phase π.

In FIG. 4A, the periodic patterns 1 and 2 have a difference in regard to the size. The periodic pattern 1 is so arranged that the edge portion of zero intensity defined by the phase difference between adjacent patterns is registered with the whole of the standard exposure pattern of FIG. 4B. The periodic pattern 2 is arranged so that the edge portion thereof is registered with the fine line of the standard exposure pattern of FIG. 4B.

Either the periodic pattern 1 or the periodic pattern 2 may be used as the periodic pattern. As described, there is a phase difference of 180 deg. between adjacent patterns, and a fine line is produced by using an edge portion of zero intensity defined at the boundary between the patterns. With this arrangement, all fine lines extending in different directions can be reproduced successfully.

Embodiment 2

The second embodiment concerns an example wherein a standard exposure pattern is similar to that of the first embodiment, while, as regards a periodic pattern, a very fine chromium line is present between adjacent patterns having different phases. The second embodiment will be described with reference to FIGS. 5A–5C.

FIG. 5A shows a periodic pattern, and FIG. 5B shows a standard exposure pattern, to be used practically. FIG. 5C shows a composite pattern and illustrates the positional relationship of the periodic pattern and the standard exposure pattern, for a dual exposure process. By combining a periodic pattern and a standard exposure pattern, a composite pattern of the same shape as that of the standard pattern (FIG. 5B) is produced.

As regards the light intensity distribution of the standard exposure pattern, upon a wafer, since it contains a fine line not greater than the resolution, multiple levels are produced at the fine line portion and the contact hole portion, like the first embodiment.

For reproduction of four fine lines, a periodic pattern such as shown in FIG. 5A is used. Each fine line is produced by using an edge portion of zero intensity defined by a phase difference between a zone of phase zero and a zone of phase π. In this embodiment, there is a very fine chromium line between the patterns (zones) of phases 0 and π. Regardless of the presence of such a chromium line, an image of high contrast can be produced on the basis of the edge portion of zero intensity defined at the phase difference of 180 degrees, just like the first embodiment.

Further, like the first embodiment, the size of the periodic pattern is not particularly important. Therefore, the periodic pattern may be arranged so that it is registered with the whole standard exposure pattern, or it may be arranged so that at least the edge portion thereof is partially registered with the fine line of the standard exposure pattern.

As regards the periodic pattern, as described above, there is a phase difference of 180 deg. between adjacent patterns (with a chromium line interposed therebetween), and a fine line is produced by using an edge portion of zero intensity defined at the boundary of the patterns. With this arrangement, all fine lines extending in different directions can be reproduced successfully.

Embodiment 3

The third embodiment concerns an example wherein a standard exposure pattern is similar to that of the first embodiment, while, as regards a periodic pattern, there are plural edges (boundaries) of a phase difference of 180 deg. between adjacent patterns (zones). The third embodiment will be described with reference to FIGS. 6A–6C.

FIG. 6A shows a periodic pattern, and FIG. 6B shows a standard exposure pattern. to be used practically. FIG. 6C shows a composite pattern and illustrates the positional relationship of the periodic pattern and the standard exposure pattern, for a dual exposure process. By combining a periodic pattern and a standard exposure pattern, a composite pattern of the same shape as that of the standard pattern (FIG. 6B) is produced.

As regards the light intensity distribution of the standard exposure pattern, upon a wafer, since it contains a fine line not greater than the resolution, multiple levels are produced at the fine line portion and the contact hole portion, like the first embodiment.

For reproduction of four fine lines, a periodic pattern such as shown in FIG. 6A is used. Each fine line is produced by using an edge portion of zero intensity defined by a phase difference between a zone of phase zero and a zone of phase $\pi$. The structure of the standard exposure pattern to be superposed with the standard exposure pattern is similar to that of the first embodiment. In the periodic pattern of the third embodiment, however, the fine line is not produced by using a large pattern, but, as shown in FIG. 6A, a large pattern is divided into small L-shaped zones with mutually opposite phases.

While the basic concept is similar to the first embodiment, in this embodiment, boundaries of a phase difference of 180 deg. are defined also in a region not to be superposed with the fine line. This is to improve the linewidth reproducibility for the fine line.

When a periodic pattern having an L-shaped arrangement is used, strength concentration may occur at the intersection of the L shape. Thus, as shown in FIGS. 7A–7C, each intersection or an area around it may be coated with light-blocking chromium, for further successful reproduction of a fine line.

Further, like the first embodiment, the size of the periodic pattern is not particularly important. Therefore, the periodic pattern may be arranged so that it is registered with the whole standard exposure pattern, or it may be arranged so that at least the edge portion thereof is partially registered with the fine line of the standard exposure pattern.

As regards the periodic pattern, as described above, an L-shaped pattern having a phase difference of 180 deg. between adjacent patterns, and a fine line is produced by using an edge portion of zero intensity defined at the boundary of the patterns. With this arrangement, all fine lines extending in different directions can be reproduced successfully.

Embodiment 4

The third embodiment concerns an example wherein a standard exposure pattern is similar to that of the first to third embodiments, while, as regards a periodic pattern, there are plural edges (boundaries) of a phase difference of 180 deg. between adjacent patterns (zones). The third embodiment will be described with reference to FIGS. 8A–8C.

FIG. 8A shows a periodic pattern, and FIG. 8B shows a standard exposure pattern, to be used practically. FIG. 8C shows a composite pattern and illustrates the positional relationship of the periodic pattern and the standard exposure pattern, for a dual exposure process. By combining a periodic pattern and a standard exposure pattern, a composite pattern of the same shape as that of the standard pattern (FIG. 8B) is produced.

As regards the light intensity distribution of the standard exposure pattern, upon a wafer, since it contains a fine line not greater than the resolution, multiple levels are produced at the fine line portion and the contact hole portion, like the first embodiment.

For reproduction of four fine lines, a periodic pattern such as shown in FIG. 8A is used. Each fine line is produced by using an edge portion of zero intensity defined by a phase difference between a zone of phase zero and a zone of phase $\pi$. The phases juxtaposed with each other are different from each other. The structure of the standard exposure pattern to be superposed with the standard exposure pattern is similar to that of the first embodiment. In the periodic pattern of the fourth embodiment, however, the fine line is not produced by using a large pattern, but, as shown in FIG. 6A, a large pattern is divided into small L-shaped zones with mutually opposite phases. Also, there is a chromium line disposed between adjacent patterns.

While the basic concept is similar to the first embodiment, in this embodiment, boundaries of a phase difference of 180 deg. are defined also in a region not to be superposed with the fine line. This is to improve the linewidth reproducibility for the fine line, like the third embodiment.

When a periodic pattern having an L-shaped arrangement is used, strength concentration may occur at the intersection of the L shape. Thus, as shown in FIGS. 9A–9C, each intersection or an area around it may be coated with light-blocking chromium, for further successful reproduction of a fine line.

Further, like the first embodiment, the size of the periodic pattern is not particularly important. Therefore, the periodic pattern may be arranged so that it is registered with the whole standard exposure pattern, or it may be arranged so that at least the edge portion thereof is partially registered with the fine line of the standard exposure pattern.

As regards the periodic pattern, as described above, an L-shaped pattern having a phase difference of 180 deg. between adjacent patterns, with a chromium line extending along the boundary of them, and a fine line is produced by using an edge portion of zero intensity defined at the boundary of the patterns. With this arrangement, all fine lines extending in different directions can be reproduced successfully.

Embodiment 5

The fifth embodiment concerns an example wherein a standard exposure pattern comprises a T gate pattern containing three intersecting fine lines. The fifth embodiment will be described with reference to FIGS. 10A–10C and FIG. 11.

FIG. 10A shows a periodic pattern, and FIG. 10B shows a standard exposure pattern, to be used practically. FIG. 10C shows a composite pattern and illustrates the positional relationship of the periodic pattern and the standard exposure pattern, for a dual exposure process. By combining a periodic pattern and a standard exposure pattern, a composite pattern of the same shape as that of the standard pattern (FIG. 10B) is produced.

For resolution of three fine lines, a periodic pattern may comprise at least three boundaries (edge portions) having a phase difference of 180 degrees across the same. However, with such three patterns, phases of 0 and $\pi$ cannot be defined alternately. For this reason, as shown in FIG. 10A, the periodic pattern is divided into four patterns, more than the number of fine lines, by which four boundaries of a phase difference of 180 degrees are produced. With this arrangement, a periodic pattern having alternately inverted phases can be provided. Here, as a matter of course, the three fine lines of the standard exposure pattern are to be superposed with three of the boundaries (edges) of the periodic pattern.

Namely, of the four edges of zero intensity defined by the periodic pattern of FIG. 10A, only three edges to be superposed with the fine lines of the standard exposure pattern of FIG. 10B are used in the dual exposure process.

FIG. 11 shows the results of simulations made in regard to the light intensity distribution of this pattern. The upper, middle and lower rows in FIG. 11 show the light intensity distributions of a periodic pattern, of a standard exposure pattern, and of a composite image, respectively. It is confirmed that, with the dual exposure process, longitudinal and lateral fine lines of the T gate pattern can be reproduced successfully.

As described above, when a standard exposure pattern contains fine lines of an odd number, a periodic pattern having edges of an even number is used so that a phase difference of 180 degrees is defined between adjacent patterns. Only those edges to be superposed with a desired pattern are used. By using such a periodic pattern, even in a case when a standard exposure pattern comprises fine lines of an odd number and extending in different directions, all the fine lines can be resolved successfully.

Embodiment 6

The sixth embodiment will be described with reference to FIGS. 12A–12C. This embodiment concerns a similar example wherein a standard exposure pattern comprises a T gate pattern containing three intersecting fine lines. There are bent portions at the fine line, as illustrated.

When a pattern of the same shape as that of the standard exposure pattern of FIG. 12B is to be produced, a periodic pattern having edges of a phase difference of 180 degrees corresponding to the fine lines is used, even if the fine lines are not mutually orthogonal. However, in this embodiment, like the fifth embodiment, the standard exposure pattern has fine lines of an odd number. Therefore, a periodic pattern such as shown in FIG. 12A, including an even number of edges of a phase difference of 180 degrees, with phases of juxtaposed patterns being mutually reversed, is used.

Namely, when a standard exposure pattern comprises a pattern having fine lines extending in different directions and when the number of these fine lines is odd, a periodic pattern having an even number of edges with a phase difference of 180 degrees and being disposed to be superposed with the standard exposure pattern, is used. With this arrangement, all the fine lines of the standard exposure pattern can be resolved successfully.

Embodiment 7

The seventh embodiment concerns an example wherein a standard exposure pattern comprises three fine lines extending in different directions. The seventh embodiment will be described with reference to FIGS. 13A–13C.

Figures 13A, 13B, 13C:
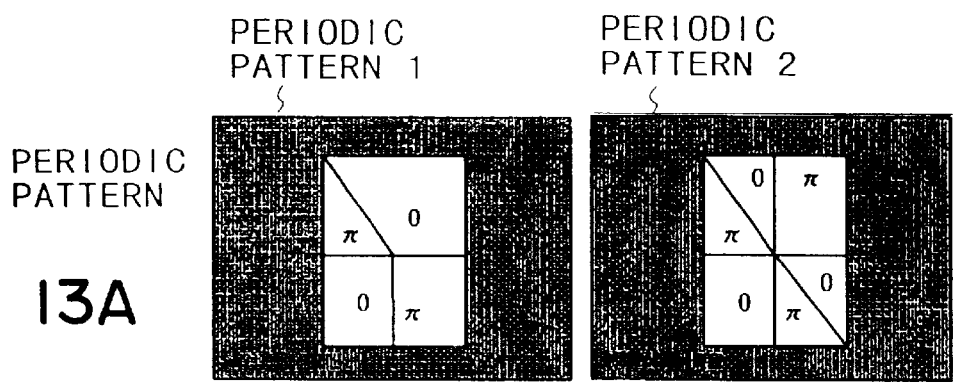
FIGS. 13A–13C are schematic views, respectively, for explaining a procedure for making a composite pattern in a seventh embodiment of the present invention.

FIG. 13A shows a periodic pattern, and FIG. 13B shows a standard exposure pattern, to be used practically. FIG. 13C shows a composite pattern and illustrates the positional relationship of the periodic pattern and the standard exposure pattern, for a dual exposure process. By combining a periodic pattern and a standard exposure pattern, a composite pattern of the same shape as that of the standard pattern (FIG. 13B) is produced.

As regards the light intensity distribution of the standard exposure pattern, upon a wafer, since it contains a fine line not greater than the resolution, multiple levels are produced at the fine line portion and the contact hole portion.

The standard exposure pattern shown in FIG. 13B includes fine lines extending in three different directions, and these lines intersect with each other at a single point. For resolution of the three fine lines, a periodic pattern may comprise three boundaries having a phase difference of 180 degrees across the same. However, with such three patterns, phases of 0 and $\pi$ cannot be defined alternately. For this reason, as shown in FIG. 13A, the periodic pattern is divided into four patterns, more than the number of fine lines, by which four boundaries of a phase difference of 180 degrees are produced. With this arrangement, a periodic pattern having alternately inverted phases can be provided.

Here, the boundaries of the periodic pattern having a phase difference of 180 deg. across the same should be placed so that they are superposed with the fine lines of the standard exposure pattern. Therefore, boundaries are first set at three locations to be superposed with the three fine lines and, then, a remaining one is set at a location other than them.

Namely, of the four edges of zero intensity defined by the periodic pattern of FIG. 13A, only three edges to be superposed with the fine lines of the standard exposure pattern of FIG. 13B are used in the pattern formation through the dual exposure process.

Since, however, the fine lines extend in three directions, boundaries of the periodic pattern having a phase difference of 180 degrees may be placed in accordance with the directions of the fine lines, as shown at a periodic pattern 2 in FIG. 13A, whereby six boundaries may be finally defined in the periodic pattern. On such an occasion, of the six edges of zero intensity defined in the periodic pattern 2 of FIG. 13A, only three edges to be superposed with the standard exposure pattern of FIG. 13B are used in the pattern formation through the dual exposure process.

As described above, when a standard exposure pattern contains fine lines of an odd number and when they intersect with each other at a single point, a periodic pattern having edges of an even number which are placed so that, about the intersection point, a phase difference of 180 degrees is defined between adjacent patterns. Only those edges to be superposed with a desired pattern are used. By using such a periodic pattern, even in a case when a standard exposure pattern comprises fine lines of an odd number and extending in different directions, all the fine lines can be resolved successfully.

Here, for placement of an even number of edges of a phase difference of 180 deg. with respect to the fine lines of an odd number, they may be placed so that the divided patterns may have the same area and angle, and that they may be registered with extensions of the fine lines. They may be placed to divide a portion having a large angle or area.

Embodiment 8

The eighth embodiment concerns an example of a practical periodic pattern to be used with a standard exposure pattern comprising a T gate pattern containing three intersecting fine lines as that of the fifth embodiment. The eighth embodiment will be described with reference to FIGS. 14A–14C.

Figure 14A:
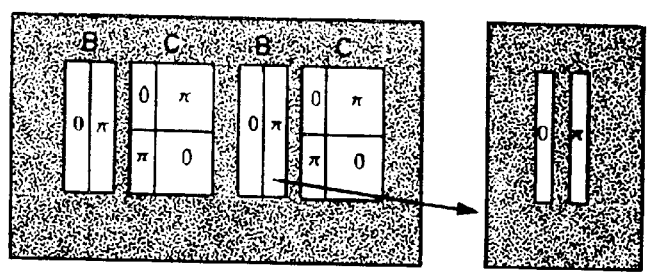
FIGS. 14A–14C are schematic views, respectively, for explaining a procedure for making a composite pattern in an eighth embodiment of the present invention.
Figure 14B:
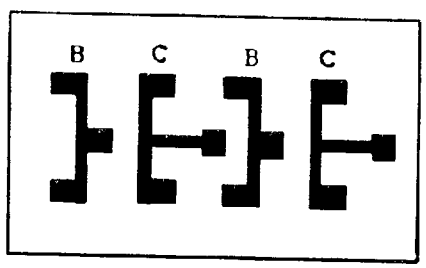
Figure 14C:
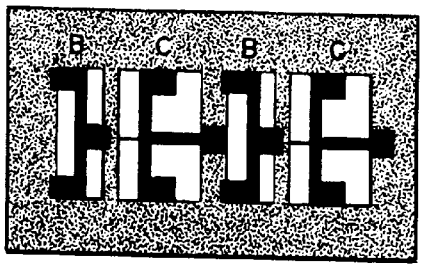

FIG. 14A shows a periodic pattern, and FIG. 14B shows a standard exposure pattern, to be used practically. FIG. 14C shows a composite pattern and illustrates the positional relationship of the periodic pattern and the standard exposure pattern, for a dual exposure process. By combining a periodic pattern and a standard exposure pattern, a composite pattern of the same shape as that of the standard pattern (FIG. 14B) is produced. The standard exposure pattern includes alternate T gates of patterns B and C as illustrated.

For resolution of all the fine lines, a periodic pattern such as shown in FIG. 14A is used. As regards the pattern B for the standard exposure, since it comprises only a single fine line, the edge is placed so that this fine line can be resolved. Also, as regards the pattern C for the standard exposure, it comprises a T gate having three fine lines intersecting in a T shape. Therefore, like the sixth embodiment, a plurality of edges are defined so that juxtaposed patterns have mutually inverted phases, and only three of them are used in the dual exposure process.

In this embodiment, a shifter edge type mask without a chromium pattern is used to produce the pattern B of the standard exposure pattern. However, a Levenson type mask with a chromium pattern may be used in place of it, as shown in FIG. 14.

As described above, when a standard exposure pattern contains fine lines of an odd number and extending in different directions, a periodic pattern having edges of an even number is used so that a phase difference of 180 degrees is defined between adjacent patterns, across the same. By using such a periodic pattern, all the fine lines can be resolved successfully.

Embodiment 9

The ninth embodiment concerns an example of a standard exposure pattern which has a hexagonal gate pattern including five intersecting fine lines. The ninth embodiment will be described with reference to FIGS. 15A–15C and FIG. 16.

FIG. 15A shows a periodic pattern, and FIG. 15B shows a standard exposure pattern, to be used practically. FIG. 15C shows a composite pattern and illustrates the positional relationship of the periodic pattern and the standard exposure pattern, for a dual exposure process. By combining a periodic pattern and a standard exposure pattern, a composite pattern (lithography pattern) of the same shape as that of the standard pattern (FIG. 15B) is produced.

For resolution of the five fine lines, a periodic pattern having edges placed about the intersection of the fine lines and defining a phase difference of 180 deg. across the same, may be used. Since, however, as described hereinbefore, when the standard exposure pattern comprises fine lines of an odd number, juxtaposed patterns have the same phase.

In consideration of it, for reproduction of a pattern having intersecting five fine lines, a periodic pattern such as shown in FIG. 15A is used. More specifically, a periodic pattern having six edges about the intersection point and providing a phase difference of 180 deg. between phases on the opposite sides of the edge, is used. Five edges of the six edges are placed, as a matter of course, so as to be superposed with the five fine lines of the standard exposure pattern.

Thus, of the six edges of zero intensity defined by the periodic pattern of FIG. 15A, only five edges to be superposed with the fine lines of the standard exposure pattern are used in the pattern formation through the dual exposure process.

Namely, when a standard exposure pattern has an odd number of fine lines extending in different directions, a periodic pattern having an even number of edges, providing a phase difference of 180 degrees between phases on the opposite sides of the edge, is used. With this arrangement, all the fine lines can be resolved successfully.

FIG. 16 shows the results of simulations made in regard to the light intensity distribution of this pattern. The upper, middle and lower rows in FIG. 16 show the light intensity distributions of a periodic pattern, of a standard exposure pattern, and of a composite image, respectively. It is confirmed that, with the dual exposure process, longitudinal and lateral fine lines of the T gate pattern can be reproduced successfully.

In a case when fine lines do not intersect with each other, as shown in FIGS. 17A–17C, namely, when extensions of the fine lines intersect with each other at a single point, what has been described above substantially applies. Also, in this case, like FIGS. 15A–15C, a periodic pattern having edges with a phase difference of 180 degrees between adjacent patterns, formed in accordance with the fine lines may be used. Only five edges to be superposed with the fine lines of the standard exposure pattern may be used in the dual exposure process.

The juxtaposition of fine lines described above may apply to a case where the spacing is not greater than 3L. However, the spacing is not particularly important. When a periodic pattern such as shown in FIG. 17A is used in the dual exposure process, the fine lines of the standard exposure pattern may have a spacing greater than it.

As described above, when a standard exposure pattern has five fine lines which intersect with each other or extensions of which intersect with each other at a single point, a periodic pattern having six edges about the intersection point is used. Only five edges of them are used in the dual exposure process. With this arrangement, juxtaposed phases are mutually inverted, such that all the fine lines of the standard exposure pattern can be reproduced successfully.

In summary, in an exposure method wherein a dual exposure process including a standard exposure and a periodic pattern exposure is to be performed, when a standard exposure pattern (to be produced finally), includes a plurality of fine lines which intersect with each other or extensions of which intersect with each other at a single point, a periodic pattern having edges of zero intensity defined about the intersection point and having a phase difference of 180 degrees between adjacent zones across the same, is used. When the number of the fine lines is even, edges may be placed only at the portions to be superposed with the fine lines. An edge or edges may be placed in a portion other than those portions.

When the number of the fine lines is odd, edges of a number larger than the fine lines by one may be placed, and the periodic pattern may be placed so that juxtaposed regions have mutually inverted phases. An edge may be placed in a region not to be superposed with the fine line.

By using a periodic pattern prepared as described above, even if a standard exposure pattern includes fine lines extending in different directions, all the fine lines of the standard exposure pattern can be reproduced successfully.

Further, like the first embodiment, as regards the length of the edge of zero intensity defined by the phase difference, it may be that, in the standard exposure pattern of FIG. 17B, the edge is superposed with the standard exposure pattern including the contact hole portion or, alternatively, it is superposed with the pattern only.

While this embodiment has been described mainly with reference to a case where the fine lines intersect with each other, they may be juxtaposed with each other.

Embodiment 10

The tenth embodiment concerns an example wherein a T gate pattern containing three intersecting fine lines is to be produced. The tenth embodiment will be described with reference to FIGS. 23A–23C.

In the fifth embodiment, a dual exposure process including a periodic pattern exposure and a standard exposure is performed. In each exposure, the threshold level of the resist is not reached. The resist threshold level is reached as a result of the dual exposure. In the tenth embodiment, as compared therewith, each of the periodic pattern exposure and the standard exposure is performed with a level beyond the resist threshold level.

FIG. 23A shows a periodic pattern, and FIG. 23B shows a standard exposure pattern, to be used practically. FIG. 23C shows a composite pattern and illustrates the positional relationship of the periodic pattern and the standard exposure pattern, for a dual exposure process. By combining a periodic pattern and a standard exposure pattern, a composite pattern of a T gate having three intersecting fine lines is produced.

For resolution of three fine lines, three boundaries having a phase difference of 180 degrees across the same are necessary. However, with such a structure, phases of 0 and π cannot be defined alternately. For this reason, as shown in FIG. 23A, a first mask is divided into four patterns, more than the number of fine lines of the T gate, by one, by which four boundaries of a phase difference of 180 degrees are defined.

By performing an exposure with the use of the first mask, a pattern of a cross shape such as shown in FIG. 23A, the right-hand side, is produced.

Subsequently, as shown in FIG. 23B as a second mask, a mask having a portion thereof covered to block light to thereby extinguish an unnecessary one of the four edges is used, and an exposure process is performed.

Finally, the required three edges of the four edges are left, and a T-shaped pattern such as shown in FIG. 23C as a composite pattern is obtained.

In this embodiment, as described above, each of the exposures using the first and second masks is performed with an exposure amount greater than the resist threshold level, as compared with the first to ninth embodiments, but substantially the same advantageous results are attainable.

As described above, even for a pattern having an odd number of fine lines intersecting with each other, by performing a dual exposure process using edges of an even number, a good pattern can be produced.

Figure 18:
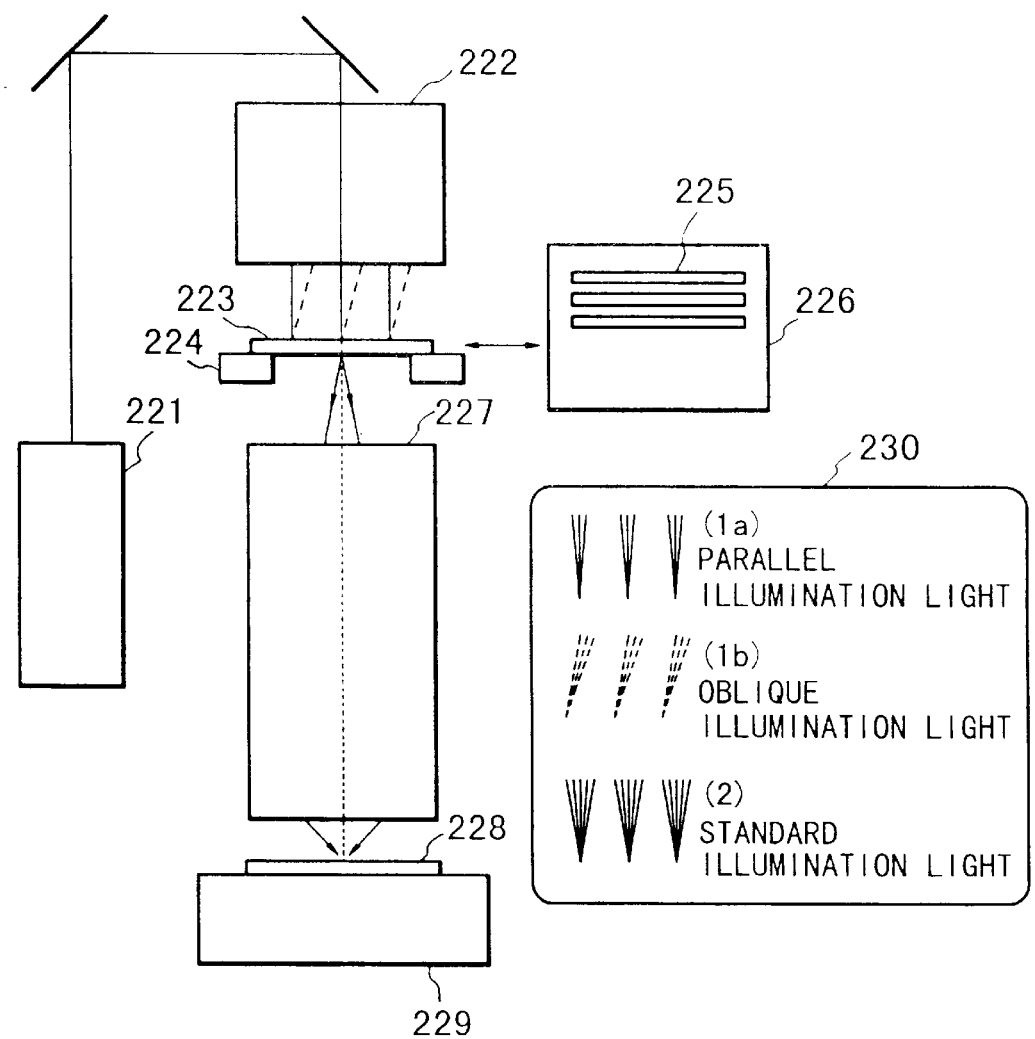
FIG. 18 is a schematic view of a high-resolution exposure apparatus with which a dual exposure process can be done.

FIG. 18 is a schematic view of a high-precision exposure apparatus with which both a dual-beam interference exposure process (periodic pattern exposure process) and a standard projection exposure process can be done. Namely, with this exposure apparatus, a multiple exposure method can be done selectively as one of plural exposure modes.

Denoted in FIG. 18 at 221 is a KrF or an ArF excimer laser, and denoted at 222 is an illumination optical system. Denoted at 223 is a mask (reticle), and denoted at 224 is a mask stage. Denoted at 227 is a projection optical system for projecting a circuit pattern of the mask 223 onto a wafer 228 in a reduced scale. Denoted at 225 is a mask (reticle) changer for selectively supplying one of a standard reticle and a Levenson type phase shift mask (reticle) and a periodic pattern mask (reticle) without having a phase shifter.

Denoted at 229 in FIG. 18 is an X–Y–Z stage to be used in both of the dual-beam interference exposure and the projection exposure. The stage 229 is movable along a plane perpendicular to an optical axis of the projection optical system 227. The position of the stage 229 with respect to the X and Y directions can be controlled precisely by use of a laser interferometer, for example.

The exposure apparatus of FIG. 18 further comprises a reticle alignment optical system and a wafer alignment optical system (off-axis alignment optical system, TTL alignment optical system, or TTR alignment optical system), not shown in the drawing.

The illumination optical system 222 has such a structure that partial coherent illumination with a large σ and partial coherent illumination with a small σ can be done interchangeably. For the partial coherent illumination with a small σ, illumination light (1a) or (1b) inside a block 203 is supplied to the Levenson type phase shift reticle, the edge shifter reticle or the periodic pattern reticle having no phase shifter, described above. For the partial coherent illumination with a large σ, illumination light (2) inside the block 203 is supplied to a desired reticle. Changing the large-σ partial coherent illumination can be done by replacing an aperture stop disposed just after the fly's eye lens of the standard optical system 222 by a stop for coherent illumination, having a sufficiently small aperture diameter as compared with that of the former.

Figure 19:
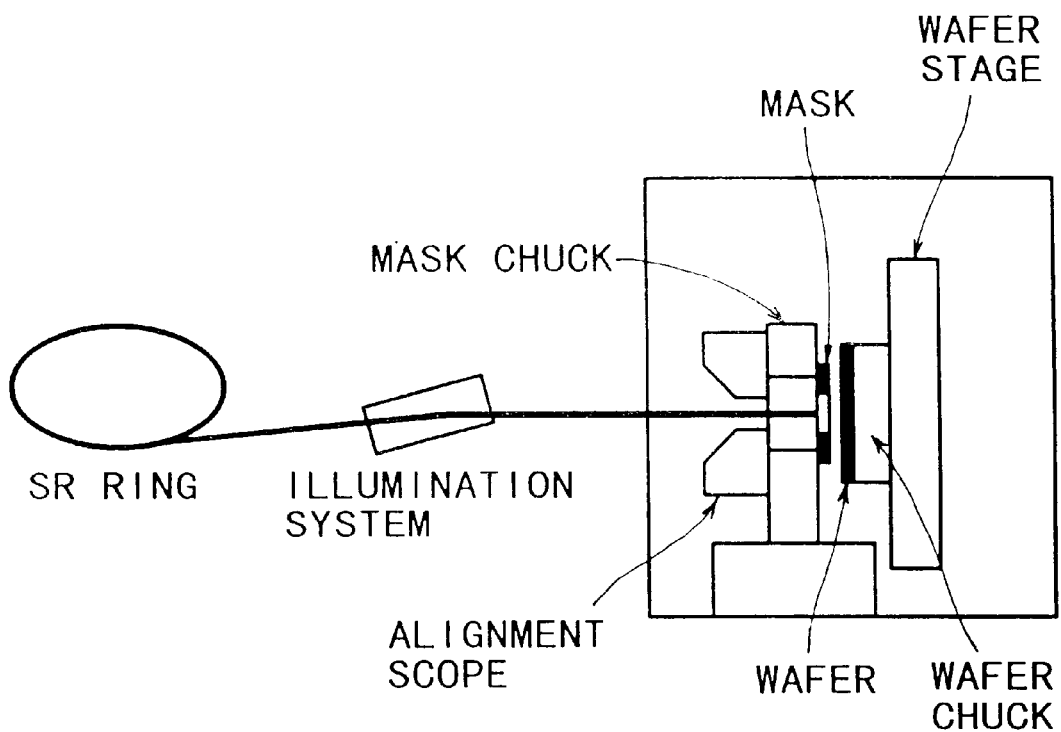
FIG. 19 is a schematic view of an X-ray exposure apparatus.
Figure 22:
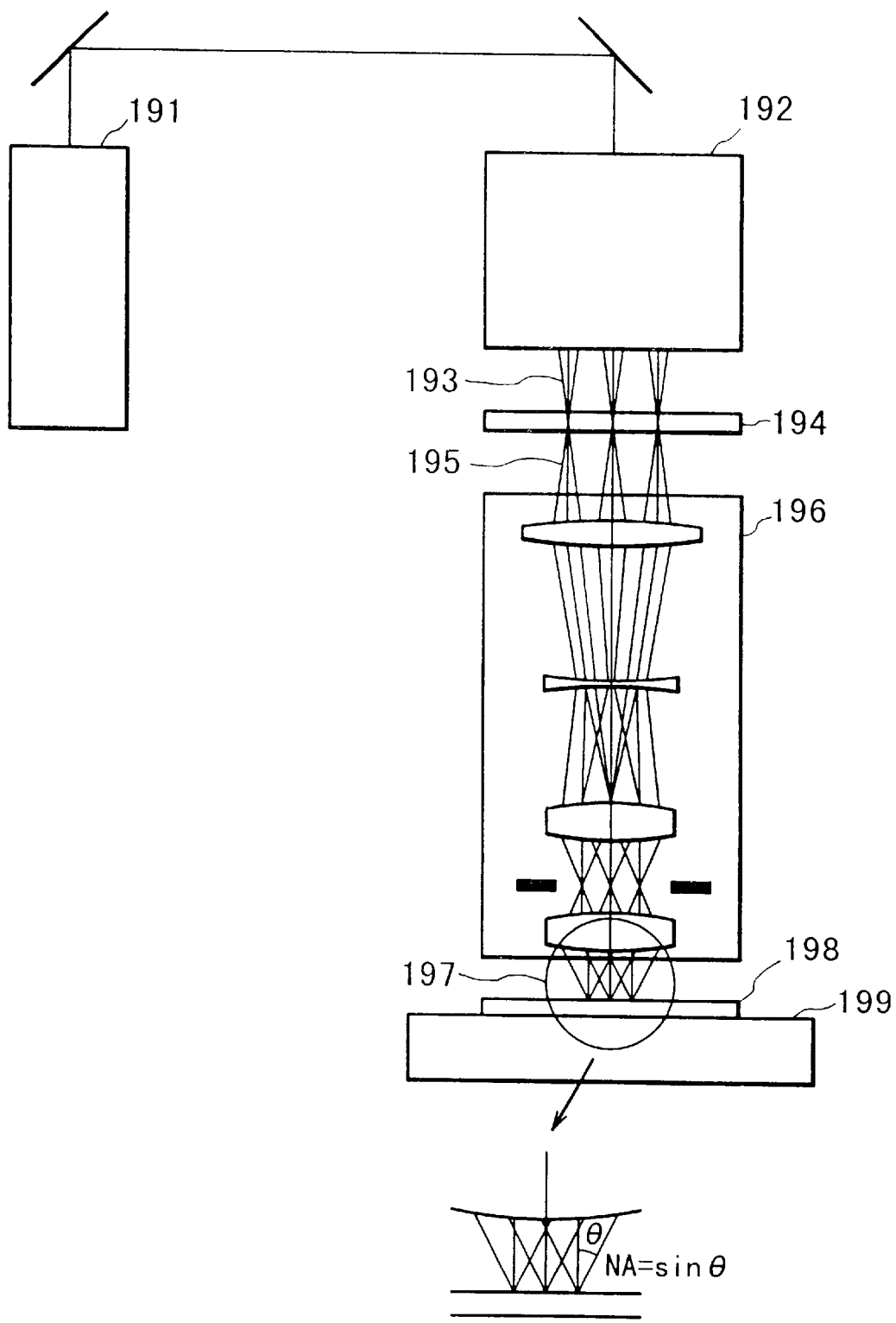
FIG. 22 is a schematic view of a conventional projection exposure apparatus.

The exposure procedure according to the present invention may be done by use of an X-ray exposure apparatus of an embodiment of the present invention such as shown in FIG. 19.

While the invention has been described with reference to the structures disclosed herein, it is not confined to the details set forth and this application is intended to cover such modifications or changes as may come within the purposes of the improvements or the scope of the following claims.

What is claimed is:

1. An exposure method for printing, upon a photosensitive material, a pattern having fine lines of an odd number extending about a certain point, said method comprising:

a multiple exposure process using a phase shift mask having an even number of boundaries defined with a phase difference of 180 degrees between adjacent regions about the point, wherein the number of the boundaries is larger than the number of fine lines.

2. A method according to claim 1, wherein the boundaries of the phase shift mask are placed so that regions divided by the boundaries have substantially the same area or angle.

3. A method according to claim 1, wherein the boundaries of the phase shift mask are placed to divide a region having a larger area or angle.

4. A method according to claim 1, wherein predetermined portions of the boundaries of the phase shift mask are registered with the fine lines.

5. A method according to claim 1, wherein there are boundaries of a phase difference of 180 degrees, which are parallel to a fine line and are not registered with the fine line.

* * * * *

UNITED STATES PATENT AND TRADEMARK OFFICE
CERTIFICATE OF CORRECTION

PATENT NO. : 6,709,794 B2
DATED : March 23, 2004
INVENTOR(S) : Yumiko Ohsaki

It is certified that error appears in the above-identified patent and that said Letters Patent is hereby corrected as shown below:

<u>Title page</u>,
Item [75], Inventors, "Yumiko Ohsaki, Tochigi-ken (JP)" should read -- Yumiko Ohsaki, Utsunomiya (JP) --.

<u>Column 4</u>,
Line 23, "well meet" should read -- sufficiently meet --.

<u>Column 17</u>,
Line 49, "(reticle)" should read -- (reticle), or one of an edge shifter type mask (reticle) --.

<u>Column 18</u>,
Line 18, "illumination" should read -- illumination to the small - σ partial coherent illumination --.

Signed and Sealed this

Twenty-seventh Day of July, 2004

JON W. DUDAS
*Acting Director of the United States Patent and Trademark Office*